(12) United States Patent
Bera et al.

(10) Patent No.: US 7,431,859 B2
(45) Date of Patent: *Oct. 7, 2008

(54) PLASMA ETCH PROCESS USING POLYMERIZING ETCH GASES WITH DIFFERENT ETCH AND POLYMER-DEPOSITION RATES IN DIFFERENT RADIAL GAS INJECTION ZONES WITH TIME MODULATION

(75) Inventors: Kallol Bera, San Jose, CA (US); Xiaoye Zhao, Mountain View, CA (US); Kenny L. Doan, San Jose, CA (US); Ezra Robert Gold, Sunnyvale, CA (US); Paul Lukas Brillhart, Pleasanton, CA (US); Bruno Geoffrion, Sunnyvale, CA (US); Bryan Pu, San Jose, CA (US); Daniel J. Hoffman, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/414,017

(22) Filed: Apr. 28, 2006

(65) Prior Publication Data
US 2007/0251918 A1 Nov. 1, 2007

(51) Int. Cl.
H01L 21/00 (2006.01)
C23F 1/00 (2006.01)

(52) U.S. Cl. .............................. 216/67; 216/58; 216/59; 438/706; 438/710; 156/345.34

(58) Field of Classification Search .................. 216/58, 216/67, 59; 156/345.34; 438/710, 706
See application file for complete search history.

(56) References Cited

U.S. PATENT DOCUMENTS

| | | | |
|---|---|---|---|
| 5,685,942 A | 11/1997 | Ishii | 156/345.48 |
| 5,958,140 A | 9/1999 | Arami et al. | 118/725 |
| 6,114,258 A | 9/2000 | Miner et al. | 438/787 |
| 6,746,961 B2 | 6/2004 | Ni et al. | 438/700 |
| 6,998,014 B2 * | 2/2006 | Chen et al. | 156/345.34 |
| 2001/0010257 A1 * | 8/2001 | Ni et al. | 156/345 |
| 2003/0232504 A1 | 12/2003 | Eppler et al. | 438/709 |
| 2004/0163764 A1 * | 8/2004 | Collins et al. | 156/345.48 |
| 2004/0261712 A1 * | 12/2004 | Hayashi et al. | 118/723 E |
| 2005/0022933 A1 | 2/2005 | Howard | 156/345.47 |
| 2005/0077010 A1 | 4/2005 | Goto | 156/345.33 |
| 2006/0042754 A1 * | 3/2006 | Yoshida et al. | 156/345.1 |
| 2006/0169671 A1 | 8/2006 | Miya et al. | 216/67 |
| 2007/0247075 A1 | 10/2007 | Kim et al. | 315/111.21 |
| 2007/0249173 A1 | 10/2007 | Kim et al. | 438/711 |
| 2007/0251642 A1 | 11/2007 | Bera et al. | 156/345.26 |
| 2007/0251917 A1 | 11/2007 | Bera et al. | 216/58 |
| 2007/0254483 A1 | 11/2007 | Bera et al. | 438/689 |
| 2007/0254486 A1 * | 11/2007 | Bera et al. | 438/706 |

* cited by examiner

*Primary Examiner*—Shamim Ahmed
(74) *Attorney, Agent, or Firm*—Law Office of Robert M. Wallace

(57) ABSTRACT

A plasma etch process includes injecting process gases with different compositions of chemical species through different radial gas injection zones of an overhead electrode to establish a desired distribution of chemical species among the plural gas injection zones.

16 Claims, 13 Drawing Sheets

PLASMA ETCH PROCESS USING POLYMERIZING ETCH GASES WITH DIFFERENT ETCH AND POLYMER-DEPOSITION RATES IN DIFFERENT RADIAL GAS INJECTION ZONES WITH TIME MODULATION

BACKGROUND OF THE INVENTION

Fabrication of integrated circuits with feature sizes on the order of nanometers requires etch processes that are extremely uniform across the entire surface of a semiconductor wafer, typically about 300 millimeters in diameter. Such uniform etch processes are typically realized in a plasma etch reactor such as a capacitively coupled plasma reactor with an overhead electrode having an extremely high aspect ratio (e.g., an electrode-to-wafer gap of only 2.5 cm for a 300 mm wafer). The etch process gas includes a gas of the type that forms a protective polymer layer over photoresist or other thin film surfaces that are not to be etched, such as a fluorocarbon gas or a fluorohydrocarbon gas. Formation of such a protective polymer layer enhances etch selectivity.

Such processes exhibit a low etch rate, etch stop or taper profile at a region typically the center of the wafer and a high etch rate or bow profile at other region typically near the wafer periphery. Such a center low etch rate, etch stop or taper profile has appeared to be unavoidable for a number of reasons. First, the process gas is introduced either from the side of the wafer or over the top of the wafer. Evacuation of gas from the reactor chamber requires the gas to flow radially outwardly across the surface of the wafer, so that gases fed to the wafer center pass over the wafer periphery before being evacuated. Therefore, the residency time of the gas increases with wafer radius, so that the minimum residency time (and hence the minimum gas dissociation) occurs at the wafer center. This effect is particularly pronounced due to the high aspect ratio of the reactor chamber. This aspect ratio arises from the small electrode-to-wafer gap (e.g., about 2 cm) and the large wafer diameter (e.g., 300 mm). The low dissociation of plasma species at the wafer center results in more complex (e.g., more carbon-rich) fluorocarbon or fluorohydrocarbon plasma species at the wafer center, which tend to etch dielectric material on the wafer more slowly while depositing etch-stopping polymer more quickly, thereby depressing the etch rate at the wafer center. In contrast, the high dissociation of plasma species at the wafer edge produces simpler (more active) etch species that are relatively high in fluorine content (the extreme example of such reactive species being free fluorine) and produce low-carbon content polymer films that accumulate more slowly on photoresist surfaces. At the wafer center, the effect of low dissociation is most noticeable when etching extremely narrow openings through a dielectric thin film. At the wafer center, the polymer accumulates on the side walls of the narrow openings causing taper profile angle, and eventually, as the opening depth increases, pinches off the opening and stops further etching of the opening before the required depth is reached, a phenomenon referred to as etch stop.

These problems are exacerbated when attempting to increase the etch rate or improve profile by the expedient of increasing the process gas flow rate into the reactor chamber. Such an increase in gas flow rate does not solve the problem of non-uniform residency time radial distribution across the wafer surface (and hence the non-uniform dissociation across the wafer surface), and may even worsen the problem, thereby worsening the etch rate or etch profile non-uniformity. One approach to improving the etch rate or etch profile at the wafer center might seem to be increasing the process gas flow rate over the wafer center or decreasing it at the wafer periphery (or both). However, such a technique would further decrease the gas residency time (and dissociation) over the wafer center relative to the periphery, further worsening the etch rate or etch profile non-uniformity. Thus, there appears to be no solution to the problem.

Another reason for such problems is the process gas content. We have found that the problem arises with great severity when using particular combinations of fluorocarbon or hydrocarbon etch process gases that otherwise produce the best possible process results, such as (for example) a process gas that has, for its etchant component, $C_4F_6$ and/or $CH_2F_2$. Another example can include $CHF_3$ and/or $CF_4$. These process gases have been found to produce desired results (with the exception of the tendency for etch stop discussed above) when etching such dielectric materials as silicon dioxide or silicon nitride or low dielectric constant materials such as porous organo-silicate glass or nitrogen-doped silicon carbide, for example. It has seemed that the only way of avoiding center-low etch rate distribution or the related taper profile or etch stop problems is to employ other (less desirable) process gas mixtures.

Another cause for the center-low etch rate distribution across the wafer surface arises in a particular type of capacitively coupled etch reactor. In the beginning, a capacitively coupled etch reactor employed a single RF power source coupled between the wafer and the overhead electrode. In such a reactor, the etch rate could only be increased (to enhance productivity) by increasing the RF power. Such an increase unfortunately increases the ion energy, causing more bombardment damage to photoresist and thereby reducing etch selectivity. This problem was circumvented by introducing low frequency magnetic fields at the sides of the chamber (in lieu of increasing the RF power) to improve the etch rate, in which case the reactor is called a magnetically enhanced reactive ion etch (MERIE) reactor. This approach was successful in improving the etch rate (e.g., by a factor of 2 in some cases) without damaging the photoresist or reducing the etch selectivity. It is felt that the MERIE magnetic field boosts the etch rate by increasing ionization. Recently, the RF source power has been decoupled from the ion energy or photoresist bombardment damage by applying VHF source power that contributes primarily (or almost exclusively) to ionization while applying independently a low frequency (or HF frequency) bias power that contributes primarily (or almost exclusively) to ion energy. This permits ionization and/or dissociation to be increased, without increasing ion bombardment damage to photoresist, by increasing the VHF source power without increasing the lower frequency bias power. Nevertheless, even with such a dual frequency approach for decoupling control of dissociation and ion energy, MERIE magnets can be used. The problem is that the MERIE magnetic fields tend to have their greatest etch rate-enhancing effect nearest the wafer edge. This produces a center-low etch rate distribution across the wafer surface, which has seemed to be an unavoidable characteristic of MERIE reactors. Typically, the MERIE reactor also suffers from the effects (discussed above) of low gas residency time over the wafer center, that causes center-low etch rate distribution. The relatively high dissociation achieved in such a reactor, through the use of VHF source power and MERIE magnets, makes the non-uniformity of the dissociation (due to non-uniform gas residency time across the wafer) more critical.

SUMMARY OF THE INVENTION

A plasma etch process for etching a workpiece is carried out in a plasma reactor having a ceiling electrode overlying the process region with plural concentric gas injection zones. The process includes injecting process gases with different compositions of chemical species through different ones of the gas injection zones to establish a distribution of chemical species among the plural gas injection zones. The process gases include fluorine-rich polymerizing etch gases that promote a high etch rate, carbon-rich polymerizing etch gases that promote a high polymer deposition rate, polymer management gases (e.g., oxygen or nitrogen) that retard polymer deposition rate and an inert diluent gas that reduces etch profile tapering. The method further includes distributing the processes gases among the plural gas injection zone so that (a) the fluorine-rich etch process gases have the highest flow rate over zones of the workpiece tending to have the lowest etch rate, (b) the carbon-rich etch process gases have the highest flow rate over zones of the workpiece tending to have the highest etch rate, (c) the polymer management gases have the highest flow rate over zones of the workpiece tending to have the highest tendency for etch stop, (d) the inert diluent gas has the highest flow rate over zones of the workpiece tending to have the greatest etch profile tapering.

DETAILED DESCRIPTION OF THE INVENTION

Figure 1A:
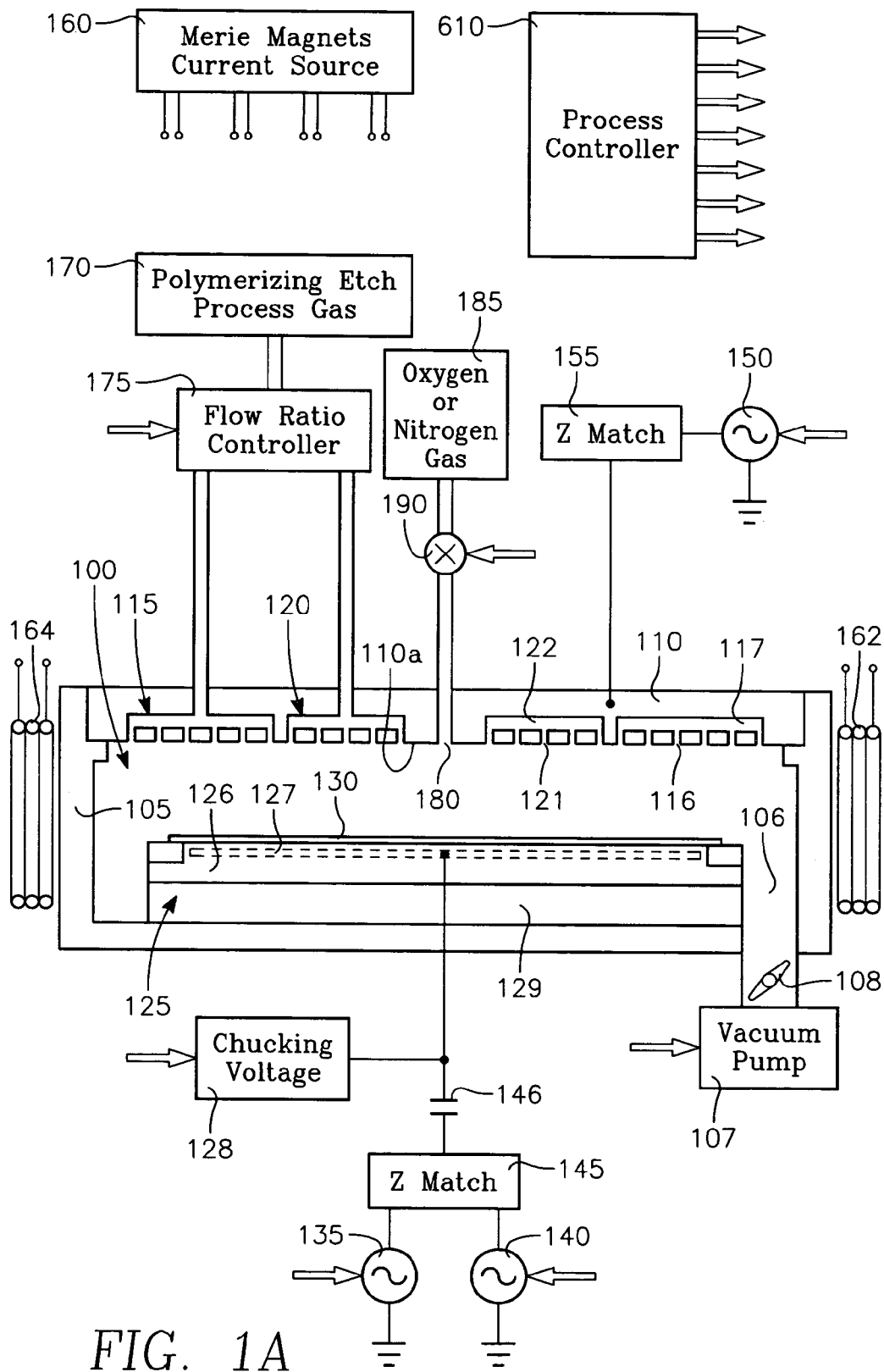
FIGS. 1A and 1B are side and top views of a plasma reactor having features for carrying out a process of the invention.

A plasma etch process etches high aspect ratio openings in a dielectric film on a workpiece in a reactor having a ceiling electrode overlying the workpiece and an electrostatic chuck supporting the workpiece. The process includes injecting a polymerizing etch process gas through an annular zone of gas injection orifices in the ceiling electrode, and evacuating gas from the reactor through a pumping annulus surrounding an edge of the workpiece. The high aspect ratio openings are etched in the dielectric film with etch species derived from the etch process gas while depositing a polymer derived from the etch process gas onto the workpiece, by generating a plasma in the reactor by applying VHF source power and/or HF and/or LF bias power to the electrodes at the ceiling and/or the electrostatic chuck. The process further includes slowing the deposition rate of the polymer, minimizing etch stop and/or increasing etch rate in a region of the workpiece typically the center by injecting oxygen or nitrogen and/or high-fluorine containing gas through gas injection orifice in the corresponding region of the ceiling electrode, and adjusting the flow rate of the oxygen or nitrogen and/or high-fluorine containing gas through the gas injection orifice to minimize the difference between etch depths and profiles at the workpiece center and the workpiece periphery. The term high-fluorine containing gas refers to a fluorocarbon or fluorohydrocarbon gas of a molecular content with a high fluorine-to-carbon ratio. Further, to counteract the etch profile to taper, diluent gas flow is increased in the corresponding region. The adjustment is performed by increasing the oxygen or nitrogen and/or high-fluorine containing gas and/or diluent flow rate over time.

The present invention solves the problem of low etch rate in a region typically at the center of the wafer that has plagued capacitively coupled plasma etch processes for etching dielectric thin films. The invention is based upon our discovery that the problem can be completely solved without requiring any increase in etch process gas flow rate over the wafer center. It is further based upon our discovery that removing or slowing deposition of polymer on sidewalls and/or bottom of narrow openings at the wafer center during the etch process is an effective solution, rather than attempting to increase the etch gas flow rate at the wafer center. Finally, the invention is based upon our discovery that a gas such as oxygen or nitrogen which does not etch dielectric material, but which does remove polymer, is an essential part of this solution. The invention is realized by providing a novel independent gas injection orifice or zone, for example, at the center of the overhead electrode that is supplied with pure oxygen or nitrogen gas with a flow rate adjustment independent of the polymerizing etch process gas flow to the inner/outer gas zones of the ceiling electrode/gas showerhead. The purpose of this new feature is to inject pure oxygen or nitrogen primarily (or exclusively) onto the wafer center, without necessarily having to alter the gas distribution of the etchant (fluorocarbon or fluorohydrocarbon) gases in the chamber. The result is that the additional gas flow over the wafer center (i.e., the added oxygen or nitrogen gas), which would be expected to reduce etch rate at the wafer center by reducing gas residency time, actually increases etch rate as high as desired, depending upon the oxygen or nitrogen gas flow rate to the center. In fact it was discovered that the dielectric etch rate at the wafer center can be increased to a level higher than any other location on the wafer, if desired, by simply increasing the oxygen or nitrogen flow (influx) rate at the wafer center. Thus, the effect of the oxygen or nitrogen gas in suppressing polymer growth at the wafer center during etch (thereby solving the etch-stop problem) outweighs the effect of increased gas flow on residency time or dissociation. Another unexpected advantage is that the photoresist etch rate (caused by ion bombardment during the dielectric etch operation) can be made more uniform by adjusting the oxygen flow rate over the wafer center.

In a situation where there is low etch rate, tapered profile or etch stop near the wafer edge or any annular section of the wafer compared to other regions, the principle of independent gas feed still applies. In this case, independent gas feed will be performed in the outer and/or intermediate zone. Although the following detailed description employs examples having center low etch rate, tapered profile or etch stop, similar scenarios exist with low etch rate, tapered profile or etch stop near the wafer edge or in any other sections of the wafer.

FIG. 1A depicts a capacitively coupled plasma reactor that includes features for carrying out the process of the invention. The reactor of FIG. 1A includes a chamber 100 defined by a cylindrical side wall 105 supporting an overhead electrode 110. The overhead electrode 110 is both an electrode and a gas distribution showerhead having an outer annular zone 115 of gas injection orifices 116 in the electrode bottom surface 110a fed from a common outer manifold 117 inside the electrode 110, and an inner annular zone of 120 of gas injection orifices 121 in the electrode bottom surface 110a fed from a common inner manifold 122 inside the electrode 110.

An electrostatic chuck (ESC) 125 supports the semiconductor wafer 130 that is to be etched. The ESC 125 has an insulating layer 126 containing a chucking electrode or grid 127 and a lower conductive base layer 129 that may be cooled. The ESC surface supporting the wafer is about one inch below the ceiling electrode bottom surface 110a, which establishes a high aspect ratio for a large (300 mm) wafer diameter. A D.C. chuck voltage supply 128 is connected to the ESC grid 127. Plasma bias power is applied by a high frequency (HF) RF generator 135 and/or a low frequency (LF) RF generator 140 through an impedance match circuit 145 and an isolation capacitor 146 to the ESC grid 127. Plasma source power is applied by a very high frequency (VHF) RF generator 150 through an impedance match element 155 to the ceiling electrode 110.

The ESC 125 and the side wall 105 define a pumping annulus 106 between them through which gas is evacuated from the chamber interior by a vacuum pump 107. A throttle valve 108 regulates the evacuation rate and chamber pressure.

In one type of such a reactor, the impedance match element 155 is a coaxial tuning stub. This type of reactor is disclosed in U.S. Pat. No. 6,838,635 by Daniel Hoffman et al. and assigned to the present assignee. Preferably, the tuning stub has a resonant frequency near the frequency of the VHF generator 150 which is near a resonant frequency formed by plasma in the chamber 100 and the ceiling electrode 110. For this purpose, the ceiling electrode reactance may be tuned to provide a resonance with the plasma near the VHF generator frequency.

Figure 1B:
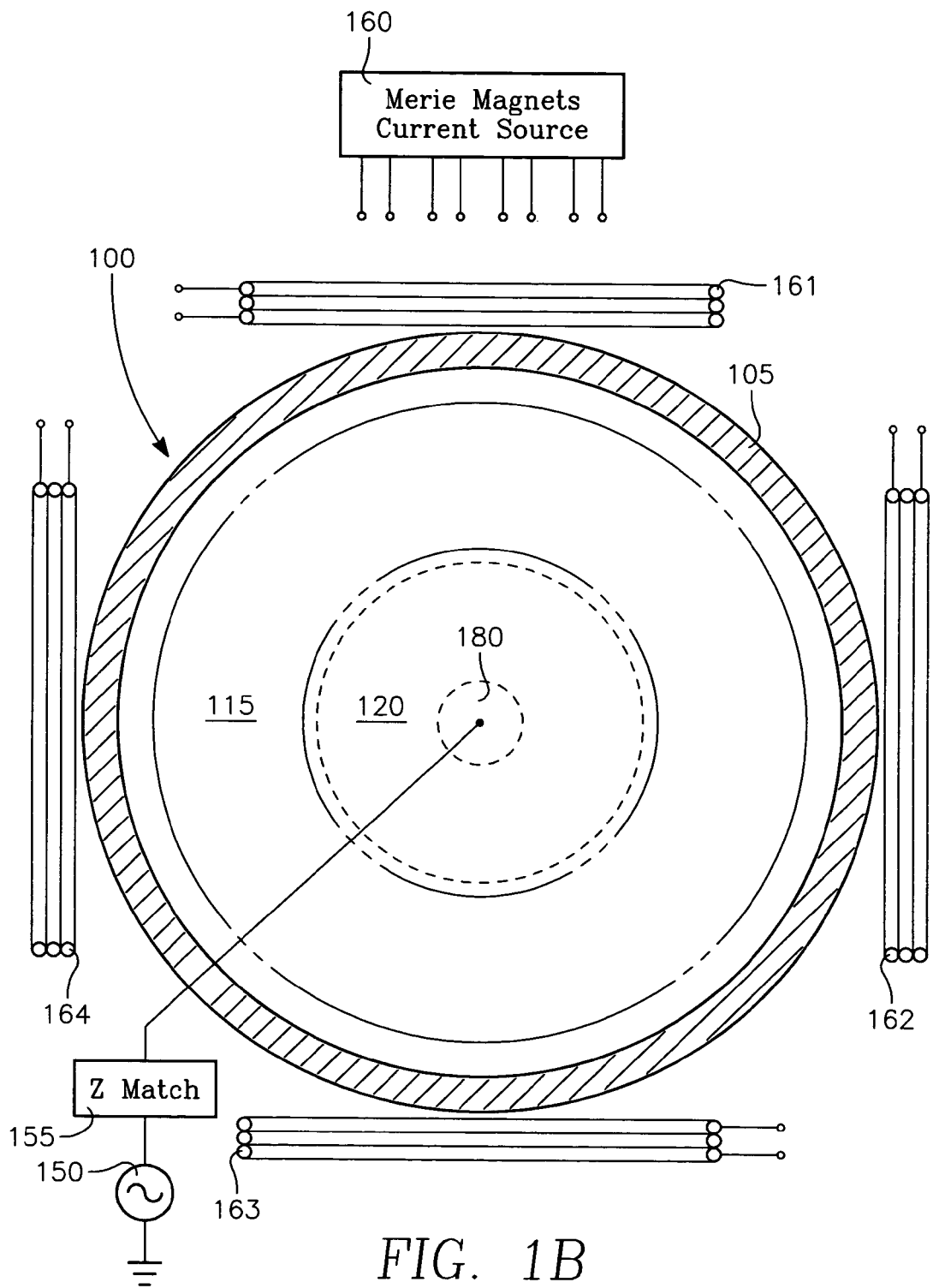

In another type of capacitively coupled reactor, the impedance match element 155 is a conventional circuit. In either type of reactor, etch performance can be enhanced by magnetically enhanced reactive ion etch (MERIE) electromagnets 161, 162, 163, 164 (shown in FIG. 1B) disposed around the sidewall 105 and driven by successively phased low frequency currents to produce a slowly rotating magnetic field in the chamber 100. The currents are provided by an MERIE current source 160. The sidewall 105 may be formed of a non-magnetic conductor such as aluminum.

Figure 1C:
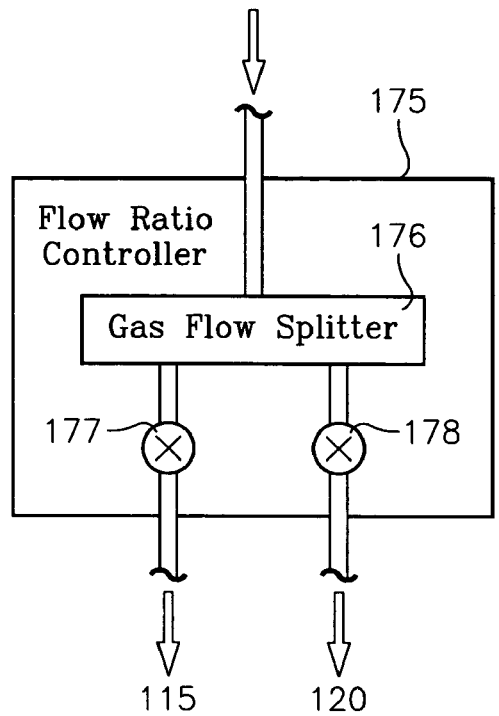
FIG. 1C depicts a gas flow splitter employed in the reactor of FIGS. 1A and 1B.

A process gas supply 170 furnishes a process gas that includes, as its main component, polymerizing etch gases (e.g., a fluorocarbon and/or fluorohydrocarbon gases) to a flow ratio controller (FRC) 175 which apportions the gas flow to the inner and outer gas manifolds 122, 117 of the inner and outer gas orifices 120, 115 of the ceiling electrode 110. The FRC 175 is depicted in FIG. 1C and consists of a gas flow divider or splitter 176b and a pair of control valves 177, 178 coupling the splitter 176 to the two manifolds 117, 122 respectively.

Conventionally, the problem of low etch rate or etch stop at the wafer center was addressed by increasing process gas flow to the inner zone 120 or decreasing gas flow at the outer zone 115. But this merely had the undesirable effect of decreasing dissociation at the wafer center and was therefore not a solution to the problem. The problem is observed in the etch profile of a deep narrow opening depicted in FIG. 2A. It is desired to form the same identical opening at both the wafer center (left side of FIG. 2A) and at the wafer periphery (right side of FIG. 2A). However, as described above, the gas residency time and (hence) the dissociation are much greater at the wafer periphery, so that more active species (simpler compounds of fluorine) are present at the wafer edge so that the polymer deposition is too slow to fill in the narrow opening before it is complete. The result is a top critical dimension (TCD) at the top of the opening and a bottom critical dimension at the bottom of the opening that are within the desired range, the opening being of the desired depth (right side of FIG. 2A). In contrast, at the wafer center (left side of FIG. 2A), the high carbon content of the polymer deposited on the side wall of the high aspect ratio opening causes the opening to be very narrow at its bottom, for a BCD that is too small, and the hole depth to be insufficient, due to etch stop at the wafer center.

Figures 2A, 2B:
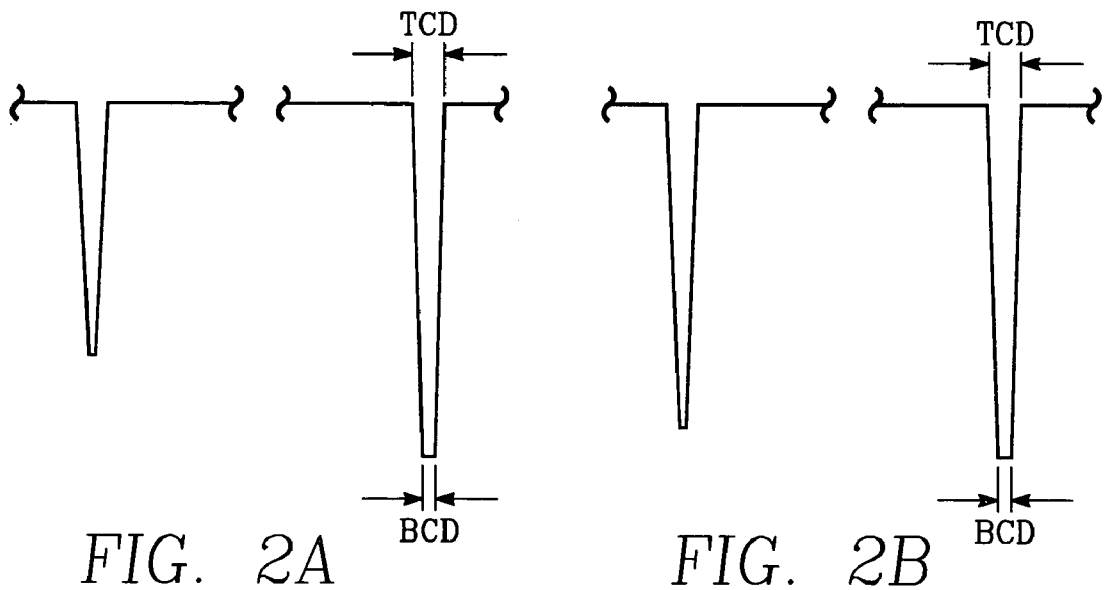
FIGS. 2A and 2B depict center and edge etch profiles obtained in a conventional process and obtained in a process of the invention, respectively.

The problem is solved by flowing pure oxygen (or nitrogen) gas to the wafer center through a center gas injection zone 180 shown in FIG. 1A. The center gas injection zone 180 may be a single gas injection orifice or many such orifices, in the center of the ceiling electrode 110. The center gas injection zone 180 receives the oxygen (or nitrogen) gas from an oxygen (or nitrogen) gas supply 185 that is independent or separate from the polymerizing etch gas supply 170. A control valve 190 controls the flow rate of the oxygen (or nitrogen) gas to the center gas injection zone 180. FIG. 2B depicts the successful results obtained using the center gas injection zone 180, in which the deep narrow opening at the wafer center (left side of FIG. 2B) has the approximately same BCD and depth as the narrow opening at the wafer periphery (right side of FIG. 2B). The flow rate of the pure oxygen or nitrogen through the center gas injection zone 180 is adjusted (or increased) using the control valve 190 until the BCD at the wafer center is about the same as the BCD at the wafer edge. Thus, non-uniformities are eliminated (or reduced) in the invention. An additional advantage is the elimination of over-etching near the wafer edge, which (prior to the present invention) was a necessary consequence of extending the etch process time sufficiently to gain a slight increase in BCD at the wafer center.

In one successful implementation, it was unnecessary to flow process gas to the outer zone 115, so that only the inner zone 120 and the center gas injection zone 180 were used.

Figure 3:
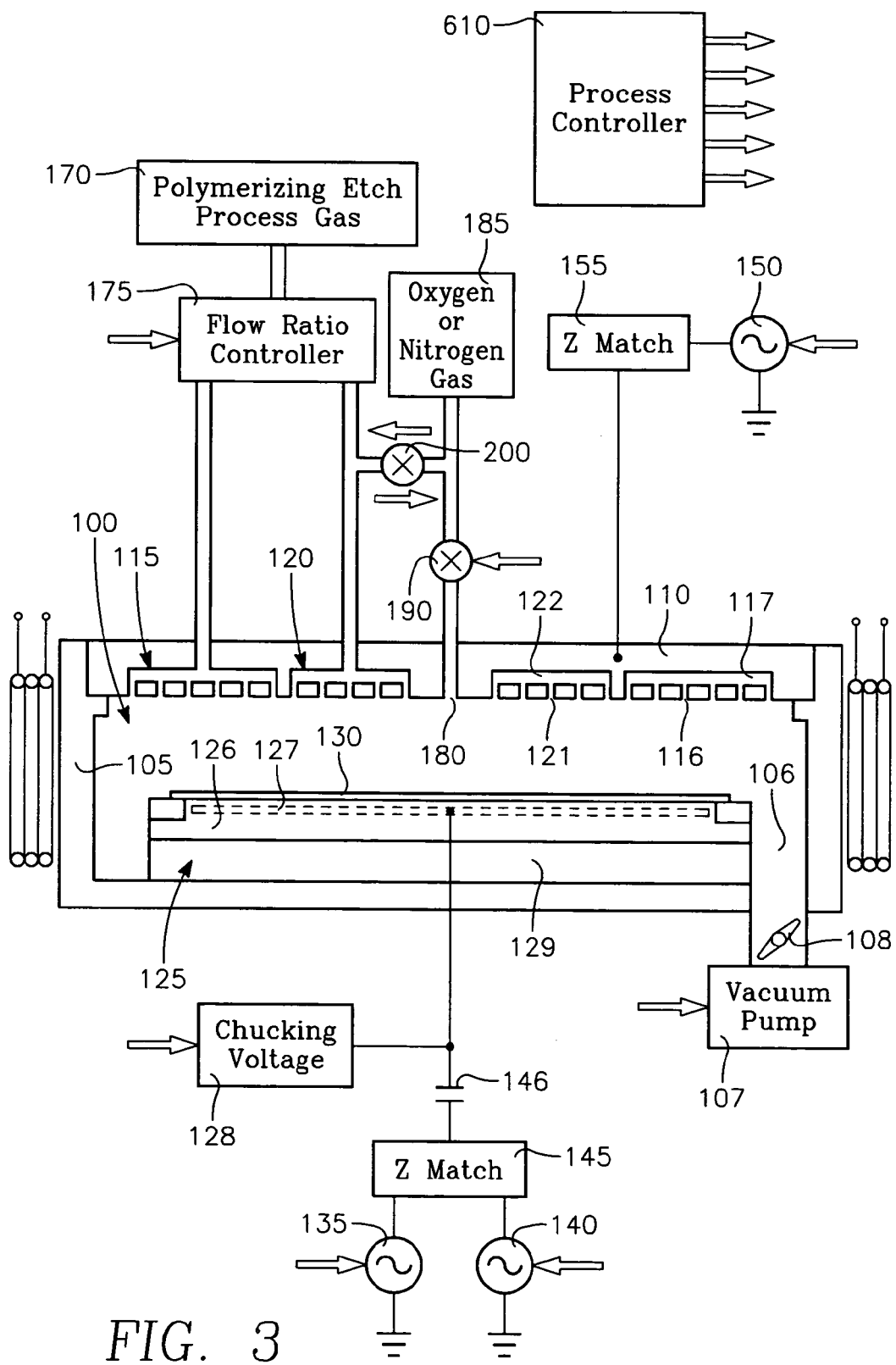
FIGS. 3 and 4 depict different gas distribution apparatus for the reactor of FIG. 1A for carrying out different embodiments of a process of the invention.

In the implementation depicted in FIG. 3, some of the oxygen (or nitrogen) from the oxygen (or nitrogen) supply 185 may be diverted through a valve 200 to the inner gas zone 120. Alternatively, some of the etch process gas may be diverted from the inner manifold 122 to the center gas injection zone 180.

Figure 4:
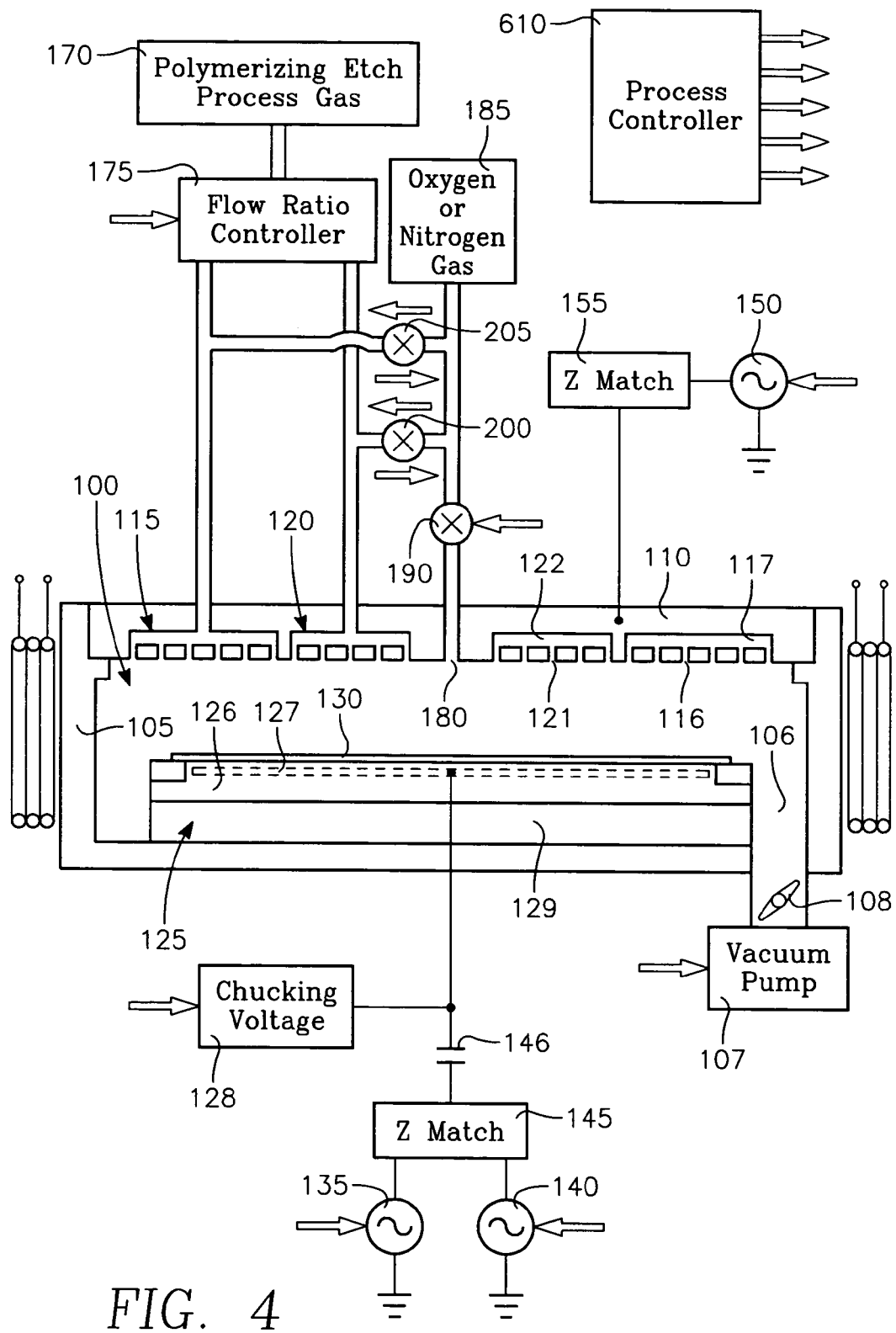

In the implementation of FIG. 4, some of the oxygen (or nitrogen) from the oxygen (or nitrogen) supply 185 may be diverted through a valve 205 to the outer gas zone 115. Alternatively, some of the etch process gas may be diverted from the outer manifold 117 to the center gas injection zone 180.

Thus, in the implementation of FIG. 3 or FIG. 4, oxygen (or nitrogen) gas flow rate radial distribution can be broadened or narrowed, as desired, by increasing or decreasing the oxygen (or nitrogen) gas flow rate to the inner and/or outer gas zones 120, 115.

Figure 5A:
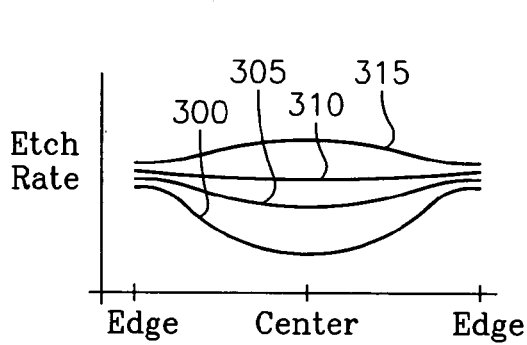
FIGS. 5A and 5B depict oxide and photoresist etch rate radial distributions obtained in a first embodiment of the invention.

FIG. 5A is a graph qualitatively comparing radial distributions of dielectric etch rates obtained in plasma etch processes with and without the invention. The results of FIG. 5A were obtained by etching a dielectric thin film layer of silicon dioxide in a capacitively coupled plasma reactor of the type depicted in FIG. 1A. The curve labeled 300 depicts a typical silicon dioxide etch rate as a function of radial location on the wafer in the case in which a polymerizing etch gas is fed through the inner zone gas injection orifices 120 with no oxygen gas (or any other gas) fed through the center gas injection zone 180. The curve 300 indicates that the etch rate is depressed at the wafer center, as expected in such a conventional capacitively coupled etch process. The curve labeled 305 depicts the oxide etch rate as a function of radial location under the same process conditions in which the curve 300 was obtained, with the addition of a modest flow rate of oxygen gas at the center gas injection zone 180. The curve 305 indicates that the oxygen gas injected through the center gas injection zone 180 causes the etch rate at the wafer center to increase somewhat, although the etch rate remains somewhat depressed at the wafer center. The curve labeled 310 depicts the oxide etch rate as a function of radial location under the same process conditions but with a significantly higher oxygen gas flow rate through the center gas injection zone 180. The curve 310 indicates that the higher oxygen flow rate through the center orifice is sufficient to raise the etch rate at the wafer center to at least nearly equal the etch rate near the wafer periphery, so that the etch rate distribution is far more uniform. The curve 315 depicts the oxide etch rate as a function of radial location under the same process conditions except that the oxygen gas flow rate through the center gas injection zone 180 is increased even further (above that used to obtain the curve 310). The curve 315 indicates that the etch rate radial distribution is center high when the oxygen gas flow rate through the center gas injection zone is very high. These results indicate that the user may increase the oxygen gas flow rate through the center zone 180 to an ideal level at which the most uniform etch rate radial distribution is attained, corresponding to the curve 310. The uniform dielectric etch rate distribution of the curve 310 corresponds to the ideal etch profile distribution depicted in FIG. 2B in which the bottom critical dimension (BCD) at the wafer center is nearly as great as the BCD at the wafer edge.

Figure 5B:
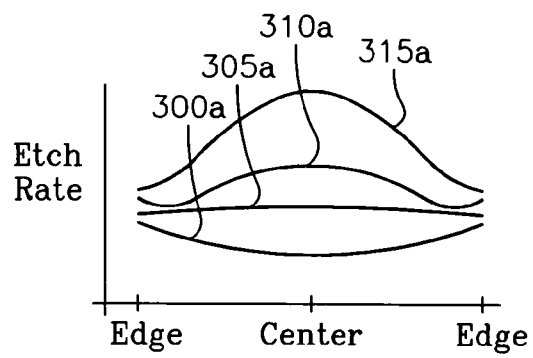

The dielectric plasma etch process is performed with a photoresist mask overlying the dielectric film, and the photoresist mask is etch by ion bombardment in the plasma (simultaneously with the etching of the dielectric thin film layer), which removes some of the photoresist during the etch step. As long as this removal merely reduces the photoresist mask thickness without removing the mask, it is acceptable. However, because partial photoresist removal can affect TCD and BCD, it is desirable that the photoresist etch rate have a radial distribution that is as uniform as possible. FIG. 5B is a graph depicting the photoresist etch rate distribution obtained in the process conditions corresponding the dielectric etch rate curves 300, 305, 310 and 315 of FIG. 5A. The curves labeled 300a, 305a, 310a and 315a of FIG. 5B depict the photoresist etch rate distributions obtained in the etch steps represented by the dielectric etch rate curves 300, 305, 310 and 315, respectively, of FIG. 5A. FIG. 5B shows that the photoresist etch rate distribution is much more responsive to the oxygen flow rate through the center gas zone 180. Specifically, an ideal oxygen flow rate through the center zone 180 corresponds to the uniform dielectric etch rate distribution represented by the curve 310 of FIG. 5A), and to the center high photoresist etch rate represented by the curve 310a of FIG. 5B. A higher oxygen gas flow rate through the center gas zone 180 produces a slightly center high dielectric etch rate represented by the curve 315 of FIG. 5, and to the much more center high photoresist etch rate represented by the curve 315a of FIG. 5B. The results illustrated in FIGS. 5A and 5B show that the response of the etch rate distribution to the flow rate oxygen gas through the center gas zone 180 is very sensitive, so that the center zone oxygen gas flow rate should be adjusted with great care to obtain the most uniform dielectric etch rate distribution without undue non-uniformity in the photoresist etch rate.

Figure 6A:
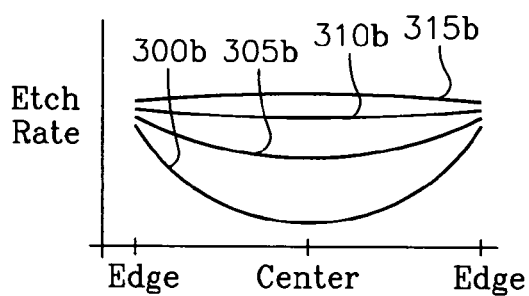
FIGS. 6A and 6B depict oxide and photoresist etch rate radial distributions obtained in a second embodiment of the invention.
Figure 6B:
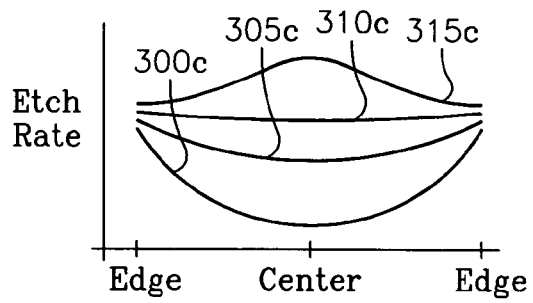

A less sensitive response by the etch rate distribution to oxygen (or nitrogen) gas flow over the wafer center may be obtained in another embodiment of the invention in which the entire gas distribution pattern is shifted radially outwardly. Specifically, the oxygen gas is fed through the inner gas zone 120 while the polymerizing etch process gas is fed through the outer gas zone 115. In this case, very little (or no) oxygen gas is fed through the center gas injection zone 180. This may be accomplished by employing the embodiment of FIG. 3, in which the only gas fed to the inner zone is oxygen from the oxygen gas supply 185 while the only gas fed to the outer zone is the etch process gas (e.g., a fluorocarbon or fluorohydrocarbon gas) from the etch process gas supply 170. For this purpose, the FRC 175 shuts off the flow of etch gas to the inner gas zone 120, and the center zone gas flow is likewise turned off at the valve 190. This embodiment retains the same approach as the preferred embodiment of FIG. 1A in that oxygen gas flow is directed to the wafer center to reduce the deposition of polymer at the wafer center, while the polymerizing etch process gas is directed to the outer portion of the wafer. However, in this alternative embodiment, the oxygen gas distribution is not as concentrated at the wafer center. The resulting response of the dielectric etch rate distribution, illustrated in FIG. 6A, is a more moderate behavior, in which the successive dielectric etch rate distributions 300b, 305b, 310b, 315b arising from successively higher oxygen gas flow rates exhibit more gradual increase in dielectric etch rate at the wafer center. Similarly, in FIG. 6B the corresponding photoresist etch rate distributions 300c, 305c, 310c, 315c arising from the successively higher oxygen gas flow rates exhibit a more gradual increase in dielectric etch rate at the wafer center, with only the highest oxygen gas flow rate resulting in a center high photoresist etch rate distribution (the curve 315c of FIG. 6B).

The sensitivity of the etch process to adjustments in the oxygen flow rate to the wafer center may be adjusted between the highly sensitive behavior of FIG. 5A and the moderate behavior of FIG. 6A by combining the features of the two embodiments. Specifically, some of the oxygen gas may be directed to the center gas zone 180 and the remainder directed to the inner gas zone 120, while some of the polymerizing etch process gas may be directed to the outer gas zone 115 and the remainder directed to the inner gas zone 120. The apportionment of these gases between the alternative paths determines how closely the process follows the sensitive behavior of FIG. 5A or the moderate behavior of FIG. 6A.

Figure 7:
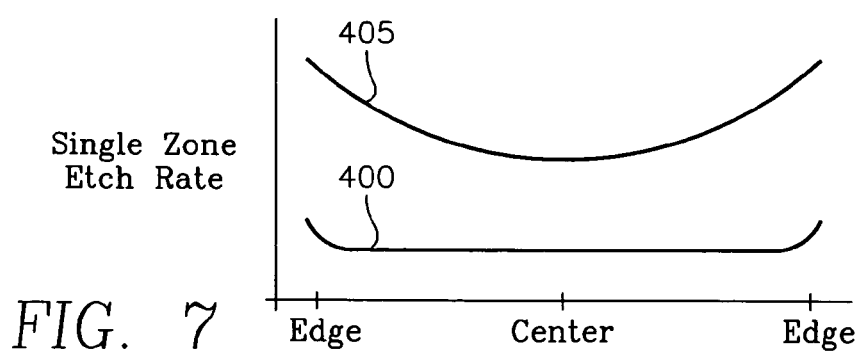
FIG. 7 is a graph depicting the effect of MERIE magnetic fields upon etch rate distribution.

FIG. 7 depicts how the pronounced center-low etch rate distributions of the curves 300 and 300a of FIGS. 5A and 6A are affected by the MERIE fields of the reactor of FIG. 1A. Without the MERIE fields, the etch rate is low and the etch rate distribution is moderately center low (the curve 400 of FIG. 7) because of the greater process gas residency time at the wafer periphery referred to above. Application of the MERIE field raises the overall etch rate while at the same time increasing the non-uniformity (center-low shape) of the etch rate distribution (the curve 405 of FIG. 7), due to the proximity of the MERIE magnets to the wafer periphery. The center low etch rate distribution of the curve 405 is corrected in the manner described above by feeding pure oxygen gas to the center gas injection zone 180.

Figure 8:
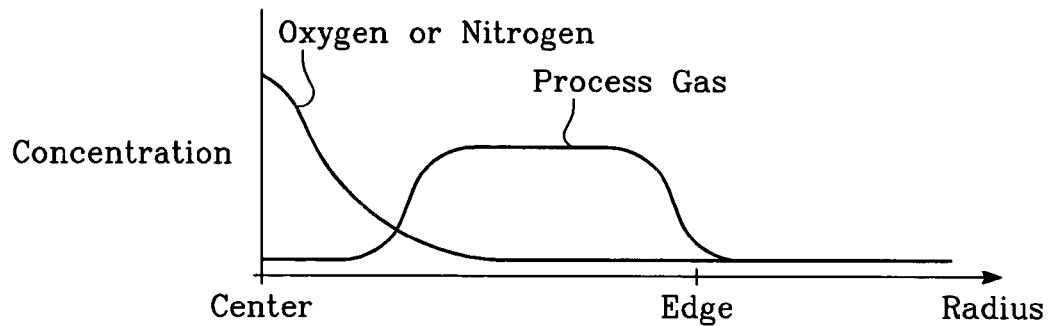
FIG. 8 is a graph of gas distribution patterns in a first embodiment of the invention.
Figure 9:
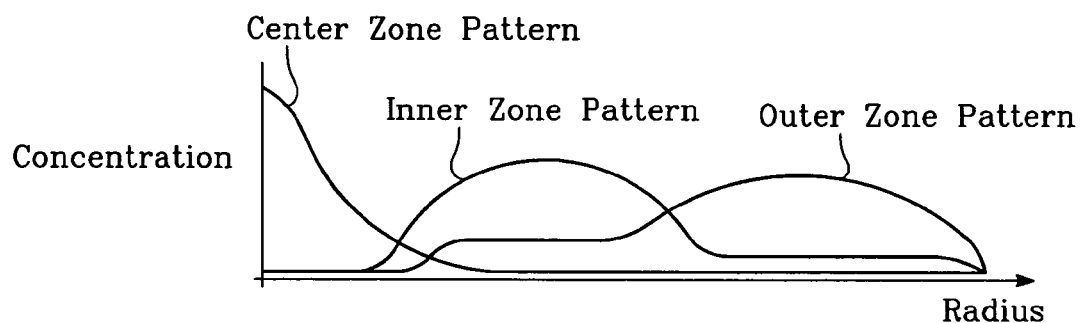
FIG. 9 is a graph of gas distribution patterns in a second embodiment of the invention.
Figures 10A, 10B, 10C:
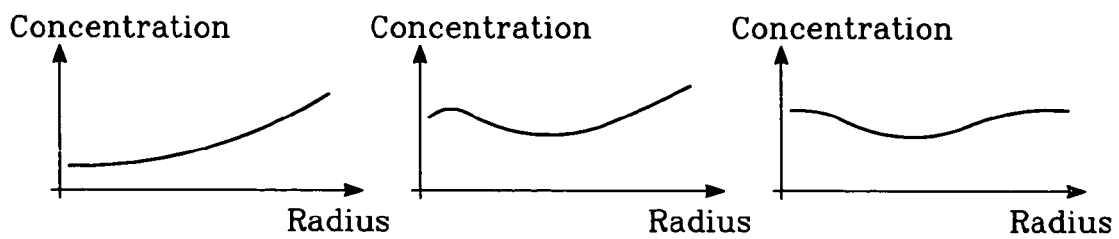
FIGS. 10A, 10B and 10C depict successively improved etch rate distributions obtained in accordance with successive steps for adjusting the etch process in accordance with an aspect of the invention.

FIG. 8 is a graph illustrating the radial distribution of gas concentration in the embodiment of FIG. 1A in which no gas is fed to the outer zone 115. In FIG. 8, the oxygen gas distribution (labeled "Oxygen" in FIG. 8) is concentrated at the wafer center while the polymerizing etch process gas distribution (labeled "process gas" in FIG. 8) is fairly uniform but is somewhat center low and edge low. FIG. 9 is a graph illustrating the radial distribution of gas concentration in the embodiment of FIG. 1A in which the oxygen gas is fed to the center zone 180, while polymerizing etch process gas is fed to both the inner zone 120 and the outer zone 115 independently. FIG. 9 shows that different gas distributions are obtained over the wafer center, middle and periphery because each of the gas injection zones 115, 120, 180 has a different gas distribution pattern. These patterns are labeled in FIG. 9, respectively, "Center Zone Pattern", "Inner Zone Pattern" and "Outer Zone Pattern". Applying different gas flow rates to the three zones 115, 120, 180 enables the gas distribution of the oxygen gas and the etch process gas to be optimized to provide the most uniform etch rate distribution. For example, a center low etch rate distribution (depicted in FIG. 10A) may be improved to a distribution having a center peak and and edge peak (depicted in FIG. 10B), by increasing the oxygen gas flow rate at the center gas zone 180. The etch rate distribution of FIG. 10B may have a dip or depression over the wafer middle, which may be lessened by adjusting the proportion of polymerizing etch process gas flow at the inner and outer zones 120, 115 to obtain the more uniform distribution depicted in FIG. 10C.

The polymerizing etch process gases that can be employed in the process of the invention can be a mixture of fluorocarbon and hydrofluorocarbon gases such as C4F6, CH2F2. This mixture may be combined with O2 or N2 and Ar. Other polymerizing etch species that can be employed in similar mixtures include C4F8, C2F4, CHF3, CF4 and CH3F. With such gases, the process of the invention can be applied to the etching of silicon dioxide thin films and silicon nitride thin films, low dielectric constant thin films, for example.

Figure 11:
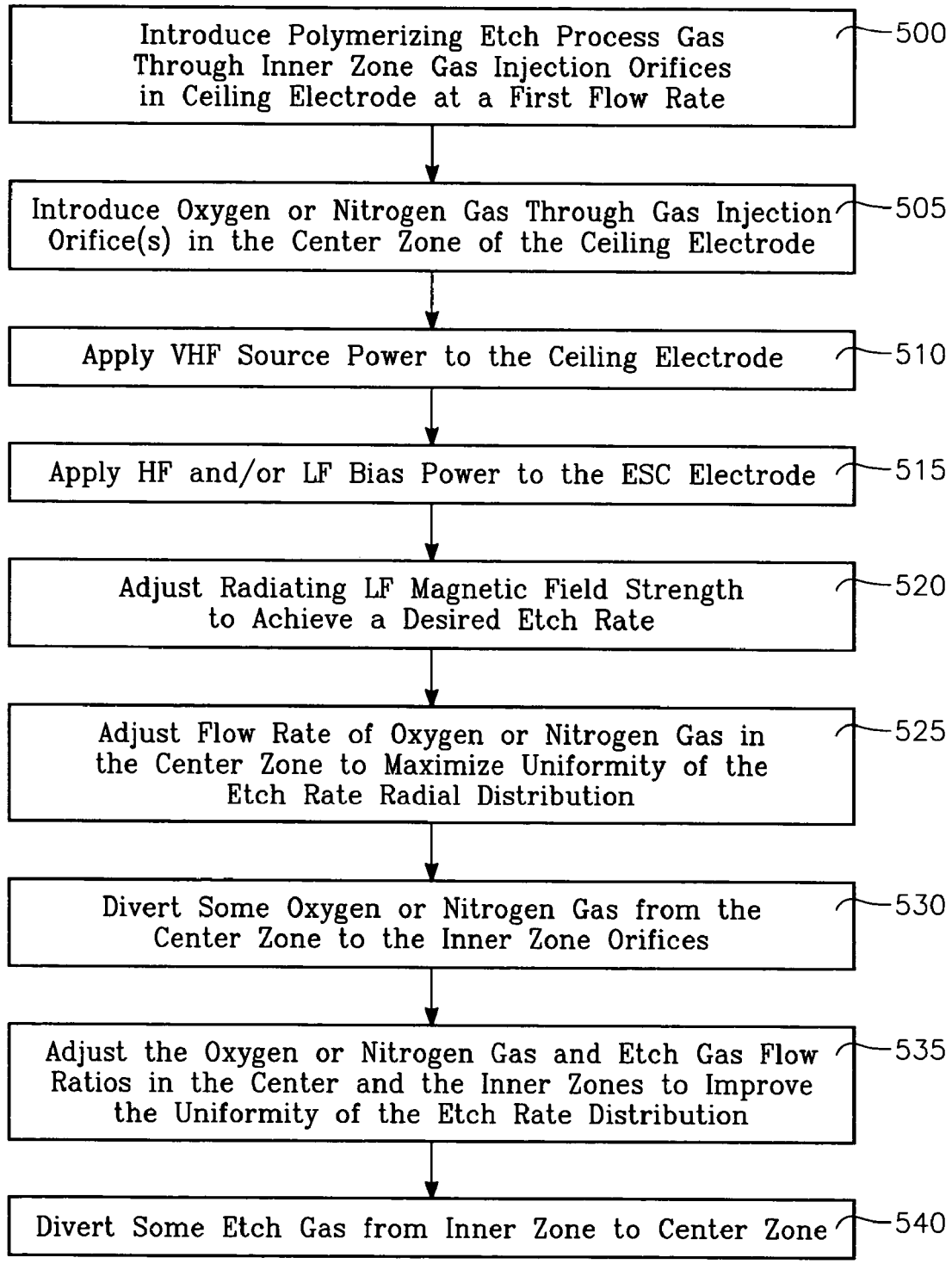
FIG. 11 is a block flow diagram of a first embodiment of a process of the invention.

FIG. 11 illustrates one process of the invention employing the reactor of FIG. 1A and using only the center and inner gas injection zones 180, 120. A polymerizing etch process gas is fed through the inner gas injection zone 120 of the ceiling electrode 110 (block 500 of FIG. 11). Oxygen gas is fed through the center gas injection zone 180 of the ceiling electrode 110 (block 505 of FIG. 11). VHF plasma source power (30 MHz to 400 MHz) is applied to the ceiling electrode 110 (block 510 of FIG. 11). RF plasma bias power is applied to the ESC grid 127 (block 515 of FIG. 11). The RF bias power may be either one or a combination of HF power (3 MHz to 30 MHz) and LF power (0.03 MHz to 3 MHz). If MERIE magnets are present, then the MERIE magnetic field is adjusted to provide a desired (enhanced) overall etch rate (block 520 of FIG. 11). The flow rate of the oxygen gas to the center gas zone 180 is adjusted, usually by increasing it, to optimize or maximize the uniformity of the radial distribution of the dielectric etch rate (block 525 of FIG. 11).

In an alternative embodiment that employs the apparatus of FIG. 3, some oxygen gas may be diverted from the center gas injection zone 180 and fed through the inner zone 120 (block 530 of FIG. 11). In this case, the ratio between the oxygen and etch gas flow rates in the inner zone may be adjusted to further enhance the uniformity of the dielectric etch rate radial distribution (block 535 of FIG. 11). In another alternative embodiment, some of the polymerizing etch process gas may be diverted from the inner gas zone 120 to be fed through the center gas zone 180 (block 540 of FIG. 11). This alternative embodiment may be applied to plasma etching of silicon nitride, oxide or low dielectric constant films, for example.

Figure 12:
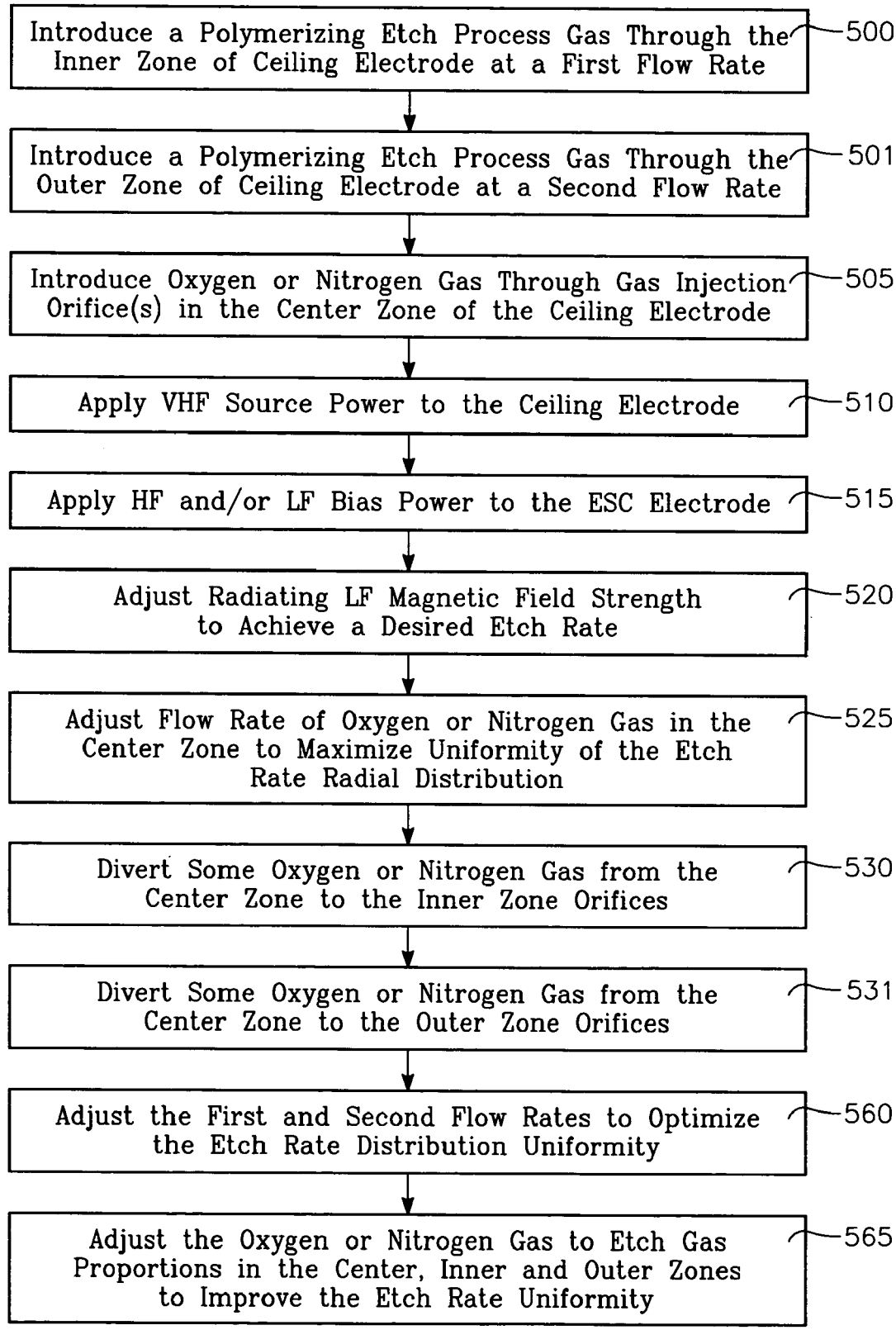
FIG. 12 is a block flow diagram of a second embodiment of a process of the invention.

FIG. 12 illustrates a process of the invention involving all three gas injection zones 115, 120, 180. It includes the steps of blocks 500 through 530 of FIG. 11. In addition, it includes the following steps: introducing a polymerizing etch process gas through the outer gas injection zone 115 (block 501 of FIG. 12); diverting some of the oxygen gas from the center zone 180 to the outer zone 115 (block 531); adjusting the inner and outer gas zone flow rates to improve etch rate uniformity across the wafer (block 560 of FIG. 12); and, adjusting the oxygen-to-etch process gas ratios in each of the center, inner and outer gas injection zones 180, 120, 115 to improve the dielectric etch rate radial distribution uniformity (block 565 of FIG. 12).

In order to carry out the foregoing processes, a process controller 610 individually controls the chucking voltage supply 128, the vacuum pump 107 and valve 108, the RF power levels of the RF generators 135, 140, 150, each of the valves 177, 178 of the flow ratio controller 175, the valve 190, the valve 200 in the embodiment of FIG. 3, and the valve 205 in the embodiment of FIG. 4. The process controller 610 may be programmable in that instructions for carrying out the process of FIG. 11 or FIG. 12 may be stored in the controller 610 for sequential execution by the controller 610.

Time and Spatial Modulation of Gas Content:

In general, etch rate decreases, etch stop occurs or etch profile becomes tapered with time as the etching progresses deeper into a high aspect ratio trench or a high aspect ratio contact opening. The problem most often is manifested nearer the wafer center, although it is possible for this problem to occur in other annular zones of the wafer, corresponding to the inner and outer gas injection zones 120, 115. Typically, the etch rate decrease or the etch profile tapering increase occurs at a higher rate at the wafer center and at a somewhat lower rate at an intermediate annular zone of the wafer (e.g., underlying the inner gas injection zone 120), and may be negligible at the wafer periphery (corresponding to the outer gas injection zone 115). However, the distribution of etch rate or etch stop and etch profile tapering may differ from this typical pattern. This problem is solved in the present invention as follows: In those zones in which this problem occurs, the flow rates of any one or all of (a) high-fluorine content etch gas, (b) diluent (inert) gas, (c) O2, or (d) N2, are increased faster than high carbon content etch gas. The high-fluorine content gas increases the etch rate and may forestall etch stop. The term high-fluorine content gas refers to a fluorocarbon or fluorohydrocarbon gas with a molecular content of a high fluorine-to-carbon ratio. The term high-carbon content gas refers to a fluorocarbon or fluorohydrocarbon gas with a molecular content of a high carbon-to-fluorine ratio. The diluent gas reduces etch profile tapering, albeit at the expense of some loss of etch rate. The O2 or N2 gases slow down the deposition of polymer, preventing etch stop and enhancing etch rate. In the typical case, etch profile becomes more tapered with time (etch depth) near wafer center, and therefore in accordance with the invention the flow rates of any one or all of the following are increased over time relative to the flow rate of high carbon content etch gas: (a) high fluorine content etch gas, (b) diluent gas, (c) O2 (or N2). In this particular example, such an increase is performed in the inner zone at a higher rate than in other zones. As another example, if the etch profile becomes more tapered over time in any particular annular zone of the wafer (which may be other than the center zone), then in that particular zone, the flow rates of any one or all of the following are increased over time relative to the flow rate of high carbon content etch gas: (a) high fluorine content etch gas, (b) diluent gas, (c) O2 (or N2). This increase is performed in the particular zone at a higher rate than in other zones if the problem is most severe in that particular zone. A similar increase may be performed in one or more of the other zones as needed, but at a lesser rate, depending upon the relative severity of the problem in the different zones.

In carrying out the foregoing method, the choice of gases whose flow rates are selected for a faster increase over time depends upon the particular problem or sets of problem occurring in the zone of interest: For etch stop, the need is to slow down the polymer sidewall/bottom deposition rate (by increasing the oxygen flow rate), or increase the etch rate (by increasing the high fluorine content etch gas flow rate). For etch profile tapering, tapering may be reduced by increasing the flow of diluent (inert) gas in the zone of interest, and/or by increasing the flow rate of high fluorine content etch gas, and/or by increasing the flow rate of the other gases (high fluorine content etch gas and oxygen or nitrogen).

The foregoing method may be carried out to different degrees in different zones simultaneously. For example, etch profile tapering may be most pronounced in the center zone of the wafer, and less pronounced in the inner annular zone and nearly absent in the outer zone. In such a case, the flow rates of some or all of the foregoing gases (i.e., (a) high fluorine content etch gas, (b) diluent gas, (c) oxygen, (d) nitrogen) may be increased over time relative to the flow rate of high carbon content etch gas, but at a faster rate of increase in the center zone and at a somewhat reduced rate of increase in the inner zone (for example). Thus, different rates of differential increase in gas flow rates may be carried out simultaneously in different gas injection zones overlying the different concentric wafer zones of interest (e.g., center, inner, outer, etc.). For example, etch stop may be the predominant problem in one of the concentric zones while etch profile tapering may be the predominant problem in another concentric zone. In such a case, oxygen (or nitrogen) gas flow rate is given the highest rate of increase (relative to all process gases) in the one zone (to retard polymer sidewall/bottom deposition), while diluent gas is given the highest rate of increase in the other zone (to reduce etch profile tapering). In both of these zones, however, the flow rates of the other process gases may also be increased over time, but at lower rates.

In a preferred embodiment, all gas flow rates are increased over time to counteract the tendency across the entire wafer for the etch rate to decrease over time (or equivalently with the depth of the etched openings). That is, the flow rates of high fluorine content etch gas, high carbon content etch gas, oxygen (or nitrogen) and diluent (inert) gases are all increased. This flow rate increase is preferably carried out in all concentric gas injection zones, but to different degrees in each zone in proportion to the etch rate decline in the each zone. For example, the gas flow rate of each process gas may have the greatest rate of increase in the center zone and have the least rate of increase in the outer zone.

Figure 13:
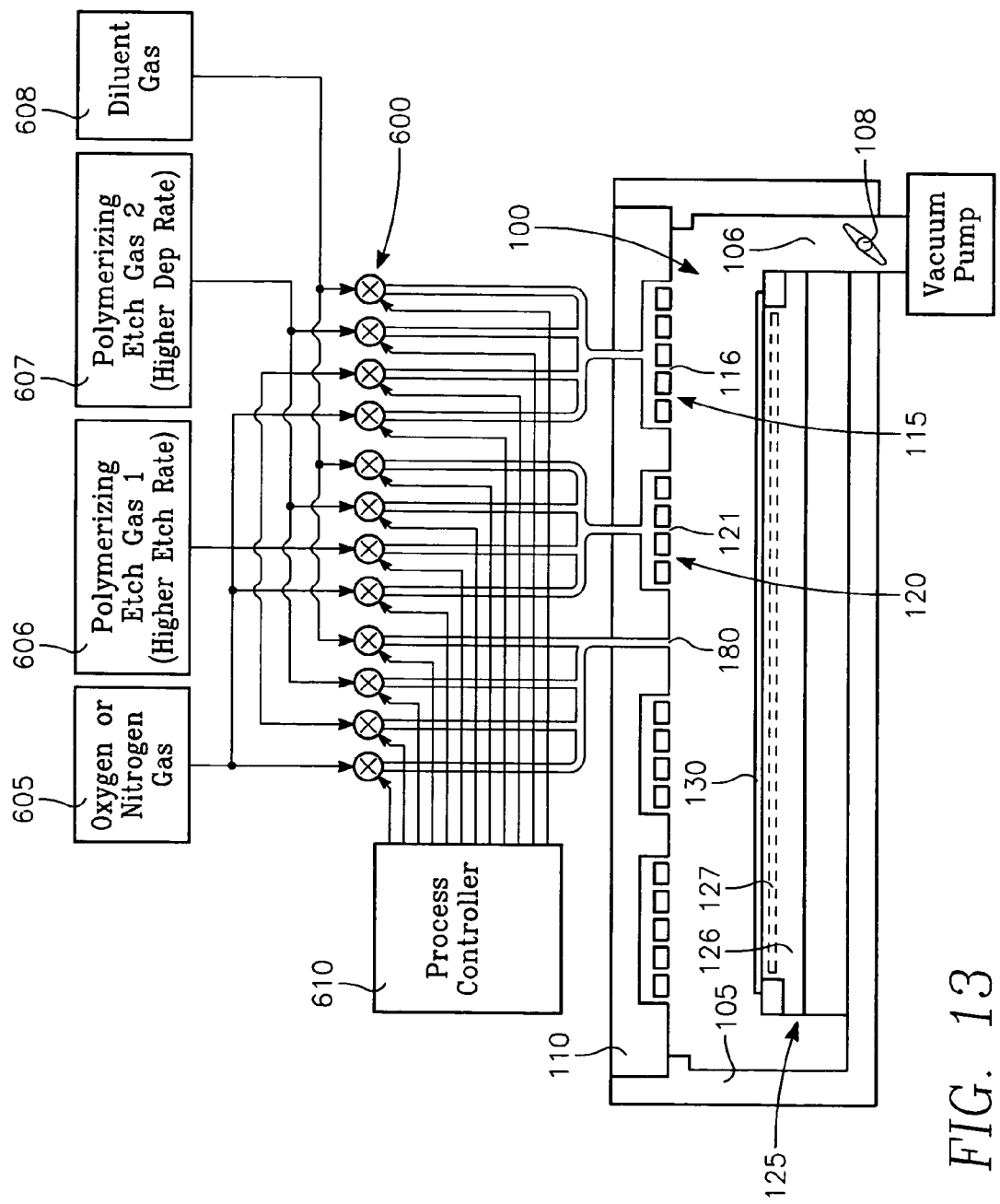
FIG. 13 illustrates a modified version of the reactor of FIG. 1A.

FIG. 13 depicts a reactor for carrying out the foregoing methods. The reactor of FIG. 13 includes the structural elements of the reactor of FIG. 1A and has, in addition, an array of individually controllable gas flow valves 600 individually controlling gas flow rates between each individual gas supply 605, 606, 607, 608 and each gas flow zone 115, 120, 180 in the ceiling electrode 110. In the embodiment of FIG. 13, there are four individual gas supplies 605-608 and three gas flow zones 115, 120, 180, and therefore the array of valves 600 has twelve valves. The gas supply 605 furnishes pure oxygen or nitrogen gas. The gas supply 606 furnishes a hydrocarbon or hydrofluorocarbon gas (or a mixture of the two) of a species having a relatively high fluorine content, such as CH2F2 for example, that (in general) exhibits a relatively high dielectric etch rate and a relatively low polymer deposition rate. The gas supply 607 furnishes a hydrocarbon or hydrofluorocarbon gas (or a mixture of the two) of a species having a relatively high carbon content, such as C4F6, for example, that (in general) exhibits a relatively high polymer deposition rate and a relatively low dielectric etch rate. The gas supply 608 furnishes a diluent gas, such as argon or xenon, for example. A controller 610 governs each of the valves 600 in an individual manner, and is capable of changing any one of the valves 600 as a predetermined function of time during the etch process. Thus, the controller 610 is capable of realizing many different radial distributions of the four process gases over the wafer and is further capable of changing any such distribution over time during an etch process. For this purpose, the controller 610 is programmable to perform precise predetermined control of each of the valves 600 during the etch process. High Fluorine containing gas is defined as a fluorocarbon or fluorohydrocarbon gas with high Fluorine to Carbon ratio. High Carbon containing gas is defined as a fluorocarbon or fluorohydrocarbon gas with high Carbon to Fluorine ratio.

Figure 14:
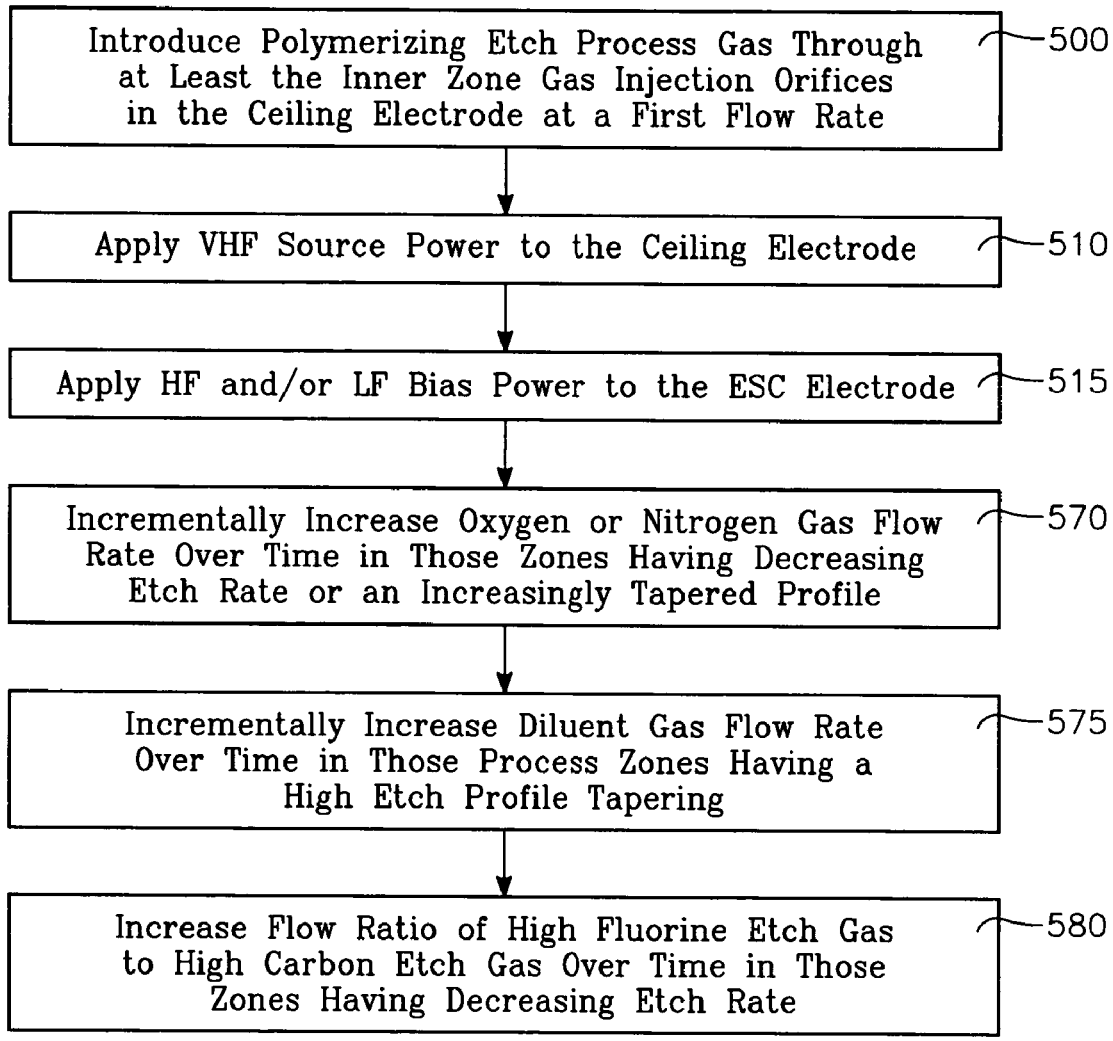
FIG. 14 is a block flow diagram of an etch process that can be performed in the reactor of FIG. 13.
Figure 15:
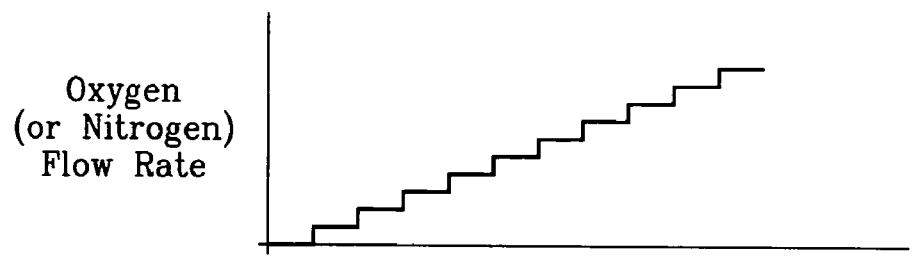
FIG. 15 is a graph depicting a time-changing oxygen or nitrogen gas flow rate in accordance with one aspect of the process of FIG. 14.

The reactor of FIG. 13 is versatile and can be employed to carry out the process illustrated in FIG. 14. For this purpose, the controller 610 may be programmed with a set of instructions for controlling the valves 600 to perform the process of FIG. 14. The process of FIG. 14 includes the process steps of blocks 500, 510 and 515 of FIG. 11 for establishing a plasma for etching a dielectric film on the wafer. In addition, the process of FIG. 14 includes the process step of block 570 in which the oxygen (or nitrogen) gas flow rate is incrementally increased over time during the etching of the dielectric film. Such an increase may be implemented by the controller 610 as a succession of incremental steps in the oxygen (or nitrogen) gas flow rate over time, as depicted in FIG. 15. This increase may be carried out in all gas flow zones of the ceiling electrode 110 (i.e., the outer zone 115, the inner zone 120 and the center zone 180). Alternatively, this increase may be carried out in the center zone 180 exclusively.

In order to counteract the tendency of the etch profile to taper (narrow) as the etch depth increases, diluent gas flow may be increased by the controller 610 (block 575 of FIG. 14) to a gas injection zone overlying a workpiece zone experiencing etch profile tapering, such as the center or inner gas injection zones. Alternatively, diluent gas may be employed to slow down a high etch rate at the wafer periphery by increasing its flow rate to a gas injection zone overlying a portion of the workpiece experiencing high etch rate, such as the outer gas injection zone. This step may be carried out by the controller 610 as a constant pattern in which diluent gas flow to the outer gas flow zone 115 is higher than in the other gas flow zones 120, 180. Alternatively, this step may be carried out by the controller 610 steadily increasing the diluent gas flow to the center or inner gas flow zones 120, 180 over time during the etch process.

As a further measure to counteract the center-low dielectric etch rate distribution, the ratio of the flow rates of the two etch process gases (the high-carbon content etch gas and the high-fluorine content etch gas) may be set by the controller 610 to different values in the inner and outer gas flow zones 120, 115 of the ceiling electrode 110 (block 580 of FIG. 14). In one example, the gas composition furnished to the inner gas zone 120 may have more high-fluorine content etch gas and less high-carbon content etch gas, while the gas composition furnished to the outer gas zone 115 may have more high-carbon content etch gas and less high-fluorine content etch gas. Such a pattern would favor less polymer formation at the wafer center, thus reducing the tendency of the process to produce undersized bottom critical dimension at the wafer center or etch stop.

Figure 16:
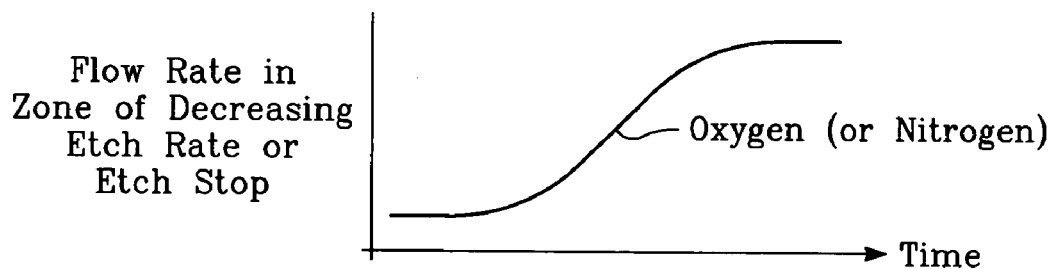
FIGS. 16, 17, 18 and 19 are graphs depicting gas flow rates over time of different species in the center, inner and outer gas flow zones, respectively.
Figure 17:
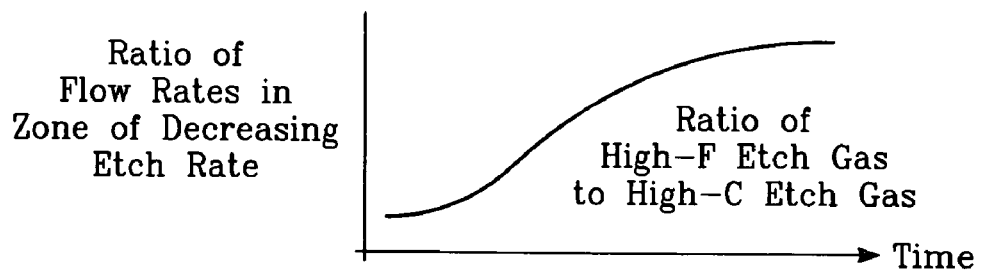
Figure 18:
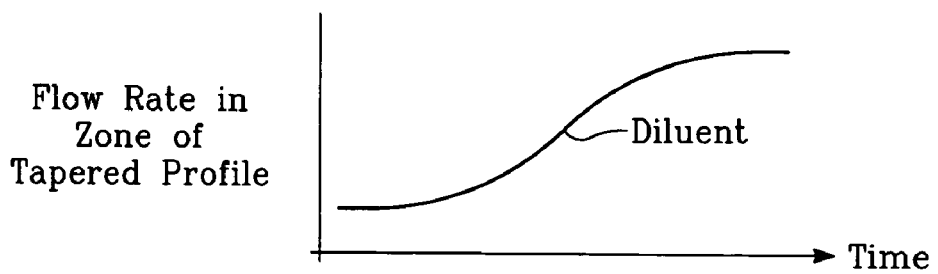
Figure 19:
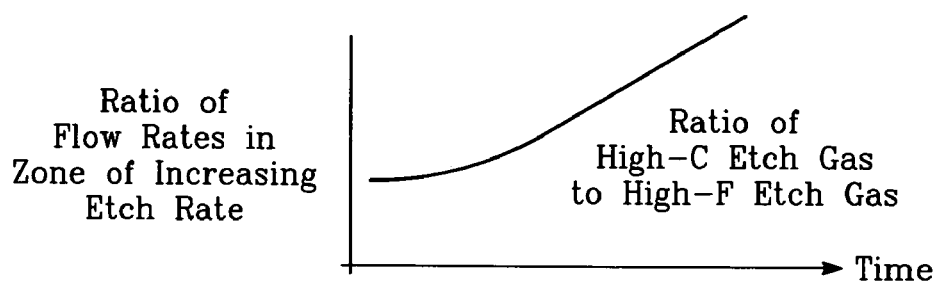

FIGS. 16, 17, 18 and 19 are contemporaneous diagrams of gas flow rates of different species in the three gas flow zones 115, 120, 180 of the ceiling electrode 110, in accordance with one example for performing a process having time-changing gas flow rates. In one zone, which is in almost all cases the center zone 180, etch rate decreases over time or actually stops. To solve this problem, the oxygen flow rate to this zone is increased over time by the controller 610 during the etch process, as shown in the graph of FIG. 16. In another zone experiencing etch stop or polymer pinch-off, which is most likely the inner zone 120, the tendency for etch stop or polymer pinch-off of narrow openings is countered by increasing over time the ratio of the high-fluorine containing etch gas relative to the high-carbon containing etch gas, as shown in FIG. 17. Also, diluent gas flow may be increased over time in the zone experiencing the greatest etch profile tapering, which is in most cases the inner zone 120, to reduce etch profile tapering or etch stop as the etch depth increases as shown in FIG. 18. In the zone having the highest (or increasing) etch rate, most likely the outer zone 115, the high etch rate (e.g., at the wafer periphery) is balanced by increasing over time the ratio of high-carbon containing etch gas relative to high-fluorine containing etch gas, as shown in FIG. 19.

Figure 20:
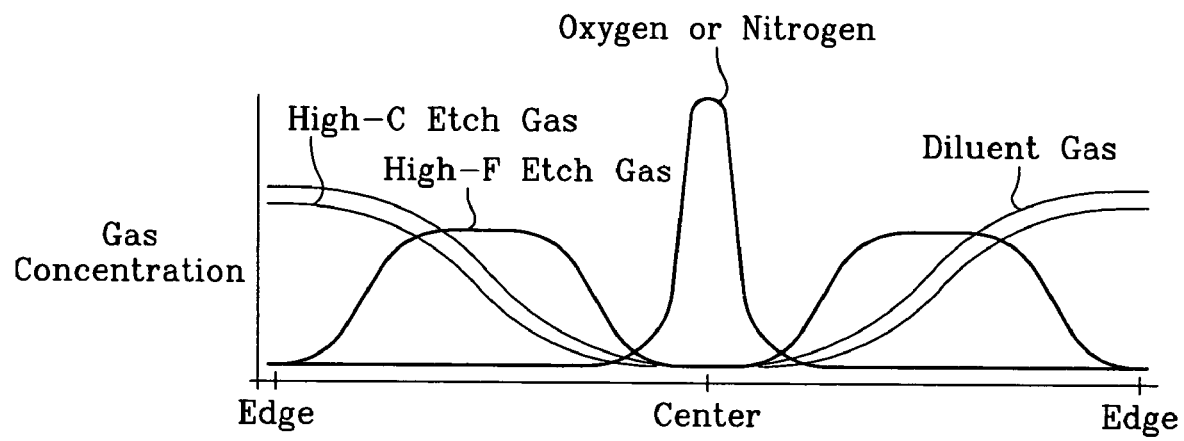
FIG. 20 is a graph of static radial distributions of different gas species in the reactor chamber in one implementation.

FIG. 20 is a graph depicting one example of gas flow distribution within the reactor chamber at a selected height over the wafer for several different process gas species. The pattern of FIG. 20 may be static for the entire etch process, or may be a snap shot of a succession of changing patterns in a time-modulated process such as that of FIGS. 16-19. In the gas flow distribution of FIG. 20, oxygen gas is narrowly confined over the wafer center. The high-fluorine containing etch gas is concentrated mainly in the intermediate zone of the wafer, while the high-carbon containing etch gas is concentrated mainly near the wafer periphery. In addition, a diluent gas is also concentrated near the wafer periphery in order to moderate the dielectric etch rate at the wafer periphery.

While the invention has been described in detail by specific references to preferred embodiments, it is understood that variations and modifications thereof may be made without departing from the true spirit and scope of the invention.

What is claimed is:

1. A plasma etch process for etching a workpiece in a process region of a reactor having a ceiling electrode overlying the process region with plural concentric gas injection zones, comprising:
   injecting process gases with different compositions of chemical species through different ones of said gas injection zones to establish a distribution of chemical species among said plural gas injection zones,
   said injecting comprising controlling respective gas flow rates to respective ones of said zones individually for each individual one of the following gases: (a) a fluorine-rich polymerizing etch gas that promotes a high etch rate, (b) a carbon-rich polymerizing etch gas that promotes a high polymer deposition rate, (c) a polymer management gas that retards polymer deposition rate and (d) an inert diluent gas that reduces etch profile tapering; and
   distributing said processes gases among said plural gas injection zones so that (a) said fluorine-rich etch process gas has the highest flow rate over zones of the workpiece tending to have the lowest etch rate, (b) said carbon-rich etch process gas has the highest flow rate over zones of the workpiece tending to have the highest etch rate, (c) said polymer management gas has the highest flow rate over zones of the workpiece tending to have the highest tendency for etch stop, (d) said inert diluent gas has the highest flow rate over zones of the workpiece tending to have the greatest etch profile tapering.

2. The process of claim 1 wherein said polymer management gas comprises one of oxygen or nitrogen.

3. The process of claim 1 further comprising increasing the flow rates of said process gases.

4. The process of claim 3 wherein the step of increasing flow rates comprises increasing the flow rate of said fluorine-rich etch process gas at a faster rate of increase over zones of the workpiece tending to have the lowest etch rate than over other zones of the workpiece.

5. The process of claim 4 wherein the step of increasing flow rates comprises increasing the flow rate of said carbon-rich etch process gas at a faster rate of increase over zones of the workpiece tending to have the highest etch rate than over other zones of the workpiece.

6. The process of claim 5 wherein the step of increasing flow rates comprises increasing the flow rate of said polymer management gas at a faster rate of increase over zones of the workpiece tending to have the highest tendency for etch stop than over other zones of the workpiece.

7. The process of claim 6 wherein the step of increasing flow rates comprises increasing the flow rate of said inert diluent gas at a faster rate of increase over zones of the workpiece tending to have the greatest etch profile tapering than over other zones of the workpiece.

8. A plasma etch process for etching a workpiece in a process region of a reactor having a ceiling electrode overlying the process region with plural concentric gas injection zones, comprising:
   applying RF plasma source power to said ceiling electrode; and
   simultaneously performing:
   (a) separately controlling respective flow rates of a first polymerizing etch process gas having a first carbon-to-fluorine ratio through respective ones of said radial gas injection zones,
   (b) separately controlling respective flow rates of a second polymerizing etch process gas having a second carbon-to-fluorine ratio less than said first ratio through respective ones of said radial gas injection zones,
   (c) separately controlling respective flow rates of a polymer management gas comprising one of oxygen or nitrogen in each of said plural concentric zones, and (d) separately controlling respective flow rates of an inert diluent gas in each of said plural concentric zones.

9. The process of claim 8 wherein the controlling respective flow rates of a polymer management gas comprises providing a maximum flow rate of said polymer management gas in one of said zones overlying a region of said workpiece tending to have the greatest polymer deposition rate.

10. The process of claim 8 wherein the controlling respective flow rates of a diluent gas comprises providing a maximum flow rate of said diluent gas in one of said zones overlying a region of said workpiece tending to have the greatest etch profile tapering.

11. The process of claim 8 wherein the separately controlling flow rates of said first and second polymerizing etch process gases comprises providing a gas mixture with a higher carbon-to-fluorine ratio through one of said zones overlying a region of said workpiece tending to have the greatest etch rate while providing a gas mixture with a higher fluorine-to-carbon ratio through another one of said zones overlying a region of said workpiece tending to have a less etch rate.

12. The process of claim 11 wherein the separately controlling flow rates of said first and second polymerizing etch process gases provide a gas mixture with a higher fluorine-to-carbon ratio through one of said zones overlying a region of said workpiece tending to have the least etch rate.

13. The process of claim 8 further comprising increasing the flow rate of said polymer management gas during said etch process.

14. The process of claim 8 wherein the controlling respective flow rates of said diluent gas is carried out to produce a distribution of said diluent gas corresponding to distribution of etch profile tapering across said workpiece.

15. The process of claim 14 wherein the controlling respective flow rates of said polymer management gas is carried out to produce a distribution of said polymer management gas corresponding to distribution of polymer deposition or etch stop across said workpiece.

16. The process of claim 15 wherein:
the separately controlling flow rates of said first and second polymerizing etch process gases comprises producing a distribution of different carbon-to-fluorine content ratios of polymerizing etch process gases across said workpiece corresponding to a distribution of etch rate across said workpiece.

* * * * *